United States Patent
Rouaissia et al.

(10) Patent No.: US 11,237,613 B2
(45) Date of Patent: Feb. 1, 2022

(54) INTELLIGENT PROXIMITY DETECTOR

(71) Applicant: Semtech Corporation, Camarillo, CA (US)

(72) Inventors: Chaouki Rouaissia, Neuchâtel (CH); Hehai Zheng, Hunan Province (CN)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/413,188

(22) Filed: May 15, 2019

(65) Prior Publication Data

US 2020/0021680 A1 Jan. 16, 2020

Related U.S. Application Data

(60) Provisional application No. 62/697,622, filed on Jul. 13, 2018.

(51) Int. Cl.
*G06F 1/3231* (2019.01)
*H04M 1/72454* (2021.01)

(52) U.S. Cl.
CPC ...... *G06F 1/3231* (2013.01); *H04M 1/72454* (2021.01); *H04M 2250/12* (2013.01)

(58) Field of Classification Search
CPC ........ G06F 1/32; G06F 1/3203; G06F 1/3206; G06F 1/3231; G06F 1/3262; G06F 1/3265; G06F 1/3287; G06F 3/011–012; G06F 3/044–0448; H04M 2250/12
See application file for complete search history.

(56) References Cited

U.S. PATENT DOCUMENTS

| 8,170,621 | B1 * | 5/2012 | Lockwood | ........ H04M 1/72569 455/566 |
| 8,907,867 | B2 * | 12/2014 | Wong | .................... G06F 1/3231 345/8 |
| 8,947,305 | B2 | 2/2015 | Amm et al. | |
| 9,247,504 | B2 | 1/2016 | Erkens | |
| 9,703,429 | B2 * | 7/2017 | Fujii | ...................... G06F 1/3262 |
| 9,723,434 | B1 | 8/2017 | Chang et al. | |
| 9,794,748 | B2 | 10/2017 | Rouaissia | |
| 9,990,086 | B2 * | 6/2018 | Asrani | ................ G06F 3/03547 |

(Continued)

FOREIGN PATENT DOCUMENTS

| CN | 103443999 A | 12/2013 |
| CN | 104167592 A | 11/2014 |

(Continued)

OTHER PUBLICATIONS

CA Translation of Chinese Office Action for Chinese Application No. 201910629546.6, dated Aug. 5, 2020, 17 pgs.

*Primary Examiner* — Gene W Lee
(74) *Attorney, Agent, or Firm* — Blank Rome LLP

(57) ABSTRACT

A capacitive proximity sensor for use in mobile devices such as smartphones and connected tables, in which it is used to switch off a display (70) when the device is brought to the ear. The capacitive sensor is arranged for rejecting spurious detection induced, for example, by condensation, ingress of water, or thermal drift, based on the time variations of a capacity seen by the readout circuit (80), Additionally, the proximity sensor may integrate signals form motion sensors, temperature sensors or other sensors, to discriminate spurious proximity signals.

11 Claims, 4 Drawing Sheets

(56) References Cited

U.S. PATENT DOCUMENTS

| | | | |
|---|---|---|---|
| 10,290,923 B2* | 5/2019 | Choi | H01Q 1/24 |
| 10,310,672 B2* | 6/2019 | Nakajima | G06F 3/04186 |
| 10,416,806 B2* | 9/2019 | Koizumi | G06F 3/0445 |
| 10,503,271 B2* | 12/2019 | Ely | G06F 3/044 |
| 2012/0043976 A1 | 2/2012 | Bokma et al. | |
| 2012/0228109 A1* | 9/2012 | Wang | H01G 5/16 |
| | | | 200/600 |
| 2016/0057578 A1* | 2/2016 | Rouaissia | H04M 1/026 |
| | | | 455/456.1 |
| 2016/0364591 A1* | 12/2016 | El-Khoury | G06F 3/04883 |
| 2017/0030119 A1 | 2/2017 | Usui | |
| 2018/0069549 A1* | 3/2018 | Cooper | H04M 1/026 |
| 2019/0025959 A1* | 1/2019 | Kapoor | G06F 3/044 |

FOREIGN PATENT DOCUMENTS

| | | |
|---|---|---|
| CN | 105892775 A | 8/2016 |
| CN | 106229614 A | 12/2016 |
| CN | 107796294 A | 3/2018 |
| EP | 2676519 A | 12/2013 |
| EP | 2988479 A1 | 2/2016 |
| EP | 3016286 A1 | 5/2016 |
| JP | 2017/032544 A | 2/2017 |

* cited by examiner

INTELLIGENT PROXIMITY DETECTOR

REFERENCE DATA

The present application claims the benefit of prior date of US provisional application 62/597,622 of Jul. 13, 2018, in the name of the same applicant. The entire contents of that application is incorporated herein by reference.

FIELD OF THE INVENTION

The present invention concerns a proximity sensor and a method for detecting the proximity of a body portion. Embodiments of the present invention particularly concern wireless mobile devices, like mobile phones, personal computer or tablets that are equipped with the proximity sensor of the invention and, based on proximity signals generated by the sensor, can inhibit a display and/or a touch sensitive panel, and/or adapt a RF power of a radio transmitter.

DESCRIPTION OF RELATED ART

It is often desired to detect whether a body portion is at short distance of an apparatus. In the special case of cell phones and wirelessly connected mobile device, (including tablets and other similar terminals). This form of proximity detection can be used as an input to the apparatus, but, for RF-emitting devices, it is known to use a proximity indication to adapt the instantaneous RF power, to comply with SAR (Specific absorption Ratio) regulations. SAR is a measure of the amount of RF energy radiated in the human body when closely in proximity to a radio emitting device (phone, tablet, laptop, etc.).

Other useful functions of portable connected devices that rely on proximity detection are: disabling the touch screen of a portable phone when it is brought to the ear for a call, lest the user may trigger unwanted actions by touching the screen with the cheek or the ear, and switching the screen backlighting off to economize energy, in the same situation.

Sensors arranged for detecting a body near to an object, including inductive, optical, heat, and capacitive based sensors, are known. In the cell phone market, the most common method today is a capacitive based sensor to detect an object near the RF antenna.

Capacitive sensors are often realized as metallized pads on a PCB but, in many cases, an existing element such as an antenna (i.e. conductive line), can double as a capacitive detector, such that the detector can be added with no surface penalty.

An example of capacitive sensor for proximity sensing in a mobile communication device is described in patent application EP2988479, in the name of the applicant, whose content is hereby included by reference.

A limitation of the known sensor systems is their sensitivity to environmental factors like, for example, temperature and humidity changes, Known sensor are known to generate false trigger signals due to the condensation of water or ice. This is particularly important when the portable devices are subject to severe environmental conditions with steep thermal gradients. The present invention aims to mitigate this problem.

BRIEF SUMMARY OF THE INVENTION

According to the invention, these aims are achieved by means of the object of the appended claims, in particular by a proximity sensor for a portable device, the sensor being arranged for detecting a body portion of a user in proximity of the portable device; the sensor comprising: a first electrode capacitively couplable with a body part of a user of the portable outside of the portable device; a second electrode capacitively couplable with a body part of a user of the portable outside of the portable device; a readout circuit operatively arranged for acquiring a capacity seen by the first electrode, the proximity sensor being arranged to generate a proximity signal based on said capacity, and to reject spurious proximity signals based on: a variation in time of a capacity read by the readout circuit; and/or signals acquired from sensors of the portable device.

Other claimed features procure desirable advantages and additional features, and include: the capability of discriminating between different directions of approach, and of generating directional proximity signals, by acquiring a capacity of a second electrode and determining proximity by using the capacities of the first and second electrode, for example by testing the difference or the ratio between said capacities, or by testing by a vector having said capacities as components falls in a given region of the cartesian plane. When the discrimination of the spurious events is based on a variation in time of a capacity, this can be the capacity of the first electrode, of the second electrode (on the back of the phone) or else the capacity of a reference device, that is less affected by physical proximity, but still varies when, for example there is a strong thermal drift, or condensation of water or of ice.

The proximity signal is use, preferably, to inhibit a touch sensitive display when the device is close to a user's body part, for example when a phone is brought to the user's ear for a call. Preferably, if the portable device includes a radio antenna, the first electrode, or the second one, may be part of that antenna, being connected at the same time to the capacity readout circuit and to the RF transceiver by suitable decoupling circuits.

Concrete variants may reject proximity signals when a time derivative of a capacity signal exceeds a given threshold. If a drift-suppression filter is present, this test should be made before the action of that drift-suppression filter and may be implemented together with the drift-suppression.

Data coming for other sensors, like motion sensors (accelerometers, position sensors, compass, gyroscope, clinometer) or other sensors (temperature, ambient light, atmospheric pressure) can be considered in the rejection of spurious proximity events as well. A decision is made on whether the data gathered form other sensors is compatible with a user approaching the sensor. In the contrary, for example if sensor-gathered data suggest that the mobile device is in fact stationary, or that there is a severe temperature drift, the proximity signal is rejected and is not applied to switch the display off, for example.

Further, when the invention is applied to a portable smartphone with a touch-sensitive screen, the first electrode would preferably be on the top of the phone, while the second one would preferably be on the back of the phone itself, opposite the display. The second electrode and/or the first one may have a shield electrode below, and/or a guard electrode in proximity, or above. Preferably, the shield and guard electrodes can be connected selectively to a voltage source or left in a high-impedance floating state.

In the context of this invention the directions "up", "down", "front", "back", refer to the normal orientation of a portable device, such as a mobile phone, with the screen facing the user and the loudspeaker up.

Further, the wording "directional" when applied to a proximity detection, indicates that the signals are processed in such a way that conductive bodies in a determined direction, for example in front of the electrode, are detected with higher sensitivity than other conductive bodies of similar characteristics in other directions, for example behind the electrode. This directional sensitivity may include combining the readings of two or more electrodes.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Although the present invention is applicable to vast array of devices including, but not limited to, cell phones, tablets, and laptop computers, examples of this description may refer simply to a phone. This should not be construed as a limitation of the invention, but merely as an example focusing on a special implementation for concision's sake.

Figure 1:
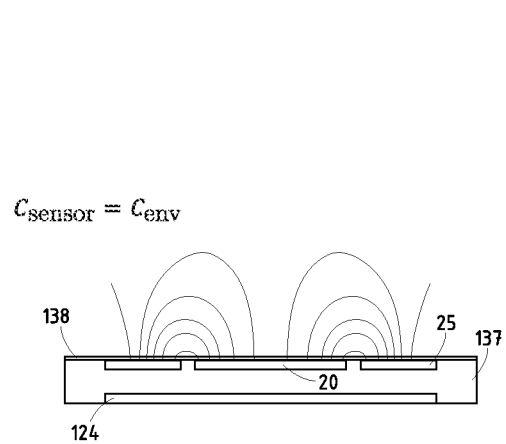
FIGS. 1 and 2 show, schematically and in cross-section, a capacitive sensor comprising a guard electrode and a back shield, far from conductive bodies, respectively in relation with an approaching conductive finger.

The functioning of a capacitive proximity detector suitable for the invention will now be recalled referring to figures. As illustrated in FIG. 1, capacitive sensors may use, as sense electrode, a conductive layer 20 on a printed circuit board or PCB 157. In the example, the electrode 20 is surrounded by a grounded ring-shaped guard electrode 25, backed by a shield electrode 23, and covered by a dielectric overlay 158, but none of these features is essential, as the shape that can be round, as shown or any other shape. The guard electrode 25 may be used to enhance the directivity of the detection, shielding the main electrode laterally. In possible variants, the guard electrode 25 may cover in part or completely the main electrode 20, or else it may be configured as a grid overlaying the main electrode. By selectively connecting the guard electrode to the ground, or the same potential as the sense electrode 20, one can change the distance at which the electric field extends above the electrodes, and the detection range with that.

In free space, far from other conductive bodies, the capacitance of the sense electrode will have a baseline value: $C_{sensor}=C_{env}$, determined from the electric induction between the electrode and all the surrounding conductors.

Figure 2:
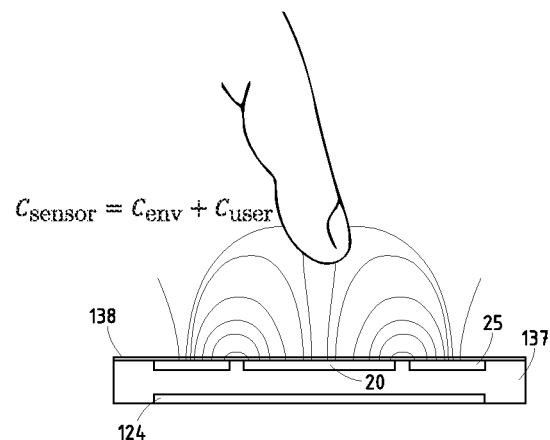

A conductive body in the proximity of the sensor, as the finger shown in FIG. 2, modifies the electric field distribution and, in general, induce an increase of the capacitance of the sense electrode: $C_{sensor}=C_{env}+C_{user}$.

It is well to realize that the increase $C_{user}$ may be much less than the baseline capacitance $C_{env}$. In a typical case, $C_{user}$ may be 1% of $C_{env}$, or even less. On the other hand, $C_{env}$ is hard to predict or simulate reliably, because it depends from several uncontrollable effects. Nevertheless, $C_{user}$ can be estimated by the formula below $$C_{User} = \frac{\varepsilon_0 \varepsilon_r A}{d}$$

where A is the common area between the two electrodes, hence the common area between the user's finger/palm/face and the sensor electrode 20, d their distance, and $\varepsilon_0$, $\varepsilon_r$ denote the absolute and relative dielectric permittivity. Conductive effects are neglected.

Figure 3:
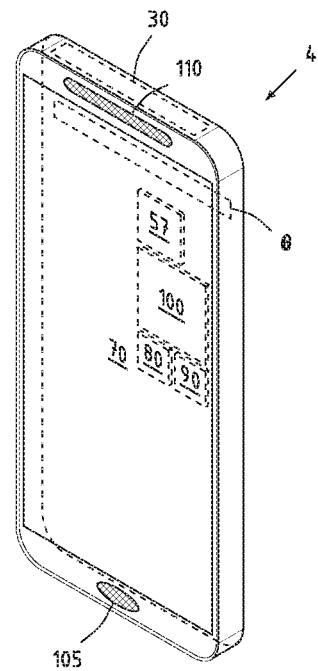
FIG. 3 shows a portable device with a capacitive sense electrode on the top, and one on the back. The first electrode doubles as RF antenna.

FIG. 3 illustrates a portable device, for instance a smartphone 40 The phone 40 includes a touch-sensitive screen panel 70 on a front side, as well as a microphone 105 and a loudspeaker 110 below, respectively above the screen 70. A desirable function of the phone is that, when the device is brought to the ear for a telephone conversation, the screen 70 should be disabled to reduce power consumption, and any contact between the screen and the user's cheek should be ignored.

The portable device 40 necessarily connects with other devices in the neighbourhood and/or in the Internet by some form of radio connection. This typically includes Wi-Fi (IEEE 802.11), and/or Bluetooth®, and/or a mobile telephone network. When the user is close to the radio source, its tissues absorb energy from the electromagnetic radiofrequency field; the absorption rate (SAR) is limited by specific regulations. Another desired function of the portable device 40 is that the RF power should be limited when a user is nearby, to comply with these rules without compromising connectivity at all times.

The portable device 40 comprises at least two electrodes for capacitively measuring proximity of a part of the user's body. A first electrode 30 is also used as RF antenna for radio communication and is usually mounted near the top of the device. A second electrode 60 is used for spatial discrimination and directivity and may be mounted on the back of the phone, behind and/or opposite the touch screen 70.

Figure 4:
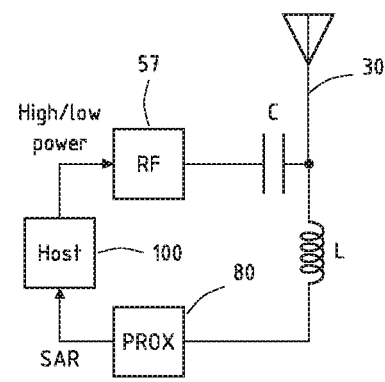
FIG. 4 shows a decoupling scheme of a capacitive electrode/antenna combination.

A same conductor can be used both as capacitive sense electrode and RF antenna by means of suitable decoupling. FIG. 4 illustrates a possible arrangement in which a conductor 30 is connected both to a RF transceiver 57 by means of a high-pass network—symbolized by the capacitor C—and to a proximity detection circuit 80 through a low-pass network—symbolized by an inductor L. When the proximity detection circuit senses that the user is close to the antenna 30, it informs the host 100 that causes the RF transmitter 57 to reduce the emission power. In a concrete implementation, the antenna may have a complex structure, with a plurality of segments, and shield and guard electrodes may be added, without departing from the general concept.

The portable device 40 includes as well one—or several—host processor 100, which may be embodied by a "system-on-chip" assembly including a general use processor, possibly encompassing several computation cores, graphical processor(s), memory, and resources for peripheral support, as well as a capacitive readout circuit 80 and, preferably, also a RF transceiver 57 and one or several sensors, for example motion sensors, gyroscopes, accelerometers, clinometers, thermometers, compass, ambient light sensor, and soon. The arrangement of these elements in the figure is given purely by way of example. These elements could be arranged otherwise, and not necessarily embodied by separate physical devices.

Figure 6:
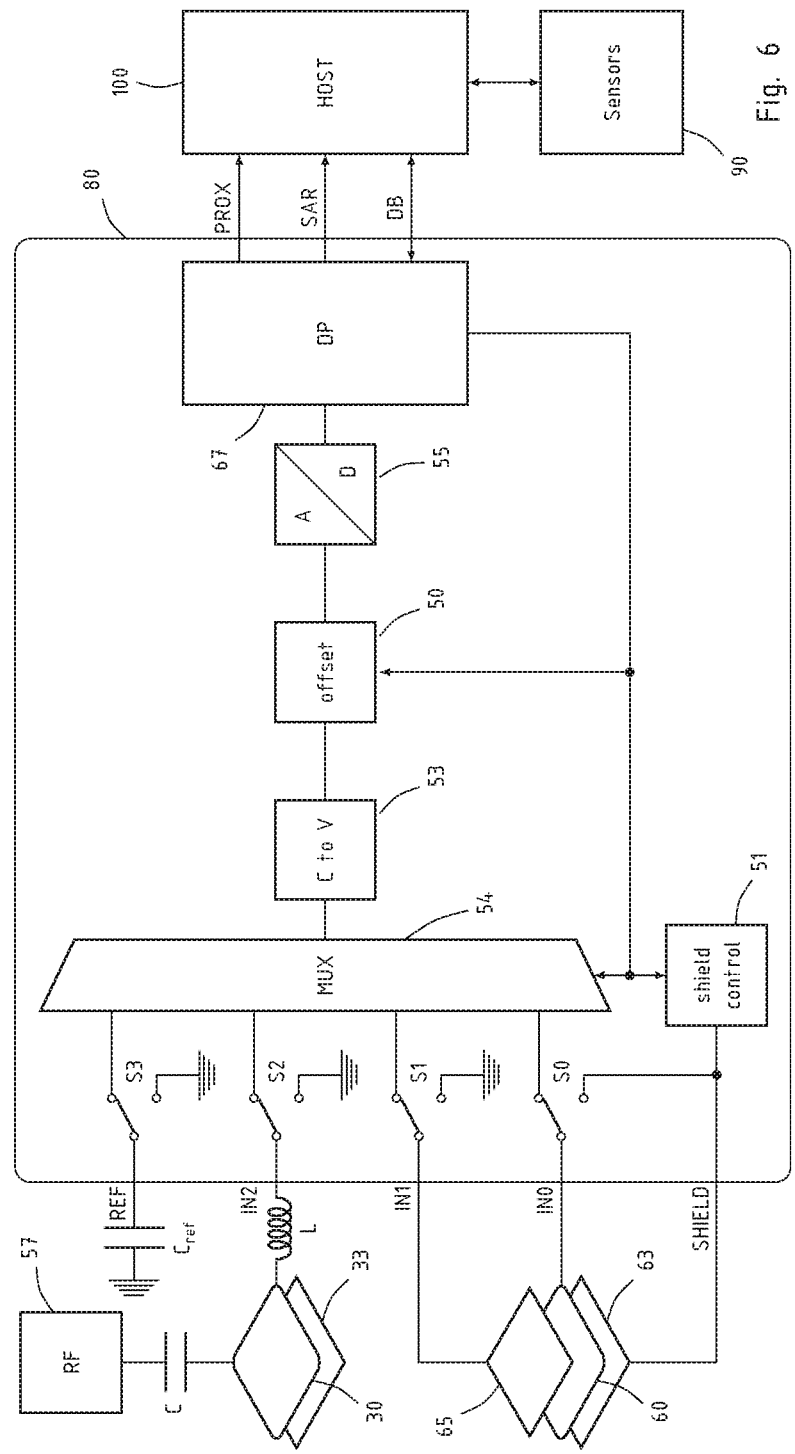
FIG. 6 shows the structure of a proximity detector according to an embodiment of the invention.

FIG. 6 shows a proximity detection circuit 80 arranged to read the capacities seen by two electrodes 30 and 60 as shown in the device of FIG. 3. The electrodes may have back shields 33, 63 that are permanently grounded, or connected to a shield control unit 51 that allows to tie them at a desired voltage or keep them floating. The second electrode 60 has a guard 65 whose capacity is read by a separate readout channel. Although the circuit 80 is drawn with three readout channels for reading the capacities seen by three electrodes, this is not a limiting feature of the invention and the number of channels could be lower, or higher, as needed.

Preferably, the readout circuit 80 is also connected to a reference capacity Cref and reads its value together with that of the electrodes 30, 60. this is used for calibration purposes.

The electrodes are connected to a capacity-to-voltage sub-circuit 53 through the multiplexer 54 that reads all the channels IN0-IN2 one by one in turn. The switches S0-S1 are preferably operated synchronously with the multiplexing cycle. The multiplexer is advantageous but is not an essential feature of the invention: parallel implementations are also possible.

The capacity-to-voltage sub-circuit 53 converts the capacity seen by the electrode into a suitable voltage signal and is followed by a programmable offset subtraction sub-circuit 50. As already mentioned, the proximity signal $C_{user}$ is superposed to a much larger baseline value $C_{env}$ that is neither known in advance nor stable. The digital processor 65 can estimate the value of the base capacity and compensate for it by programming suitable values in the offset subtraction sub-circuits 50. The compensated capacity signals are converted into numeric values by the ADC 55.

Figure 8:
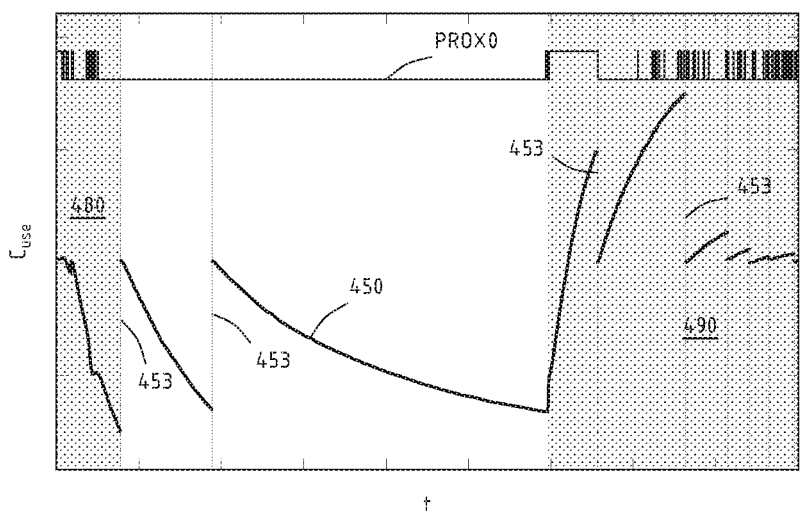
FIG. 8 plots the variations of the filtered capacity before drift suppression, and the resulting proximity flag, during an environmental testing of a portable device.

The proximity detection circuit 80 may communicate with a host processor 100 my means of a suitable data bus DB and produces one directional proximity logic flag (PROX) that signal the host that the operation of the screen 70 should be inhibited, and an omnidirectional SAR flag indicating that a part of the user's body is close to the antenna 30, and the RF power should be adapted. FIG. 8 illustrated this method in a workflow graph. The host system 100 is usually connected to the sensors 90 and has access to their values. These, however, could also be available to the readout circuit 80, either directly, or by using the host 100 as proxy.

Figure 5:
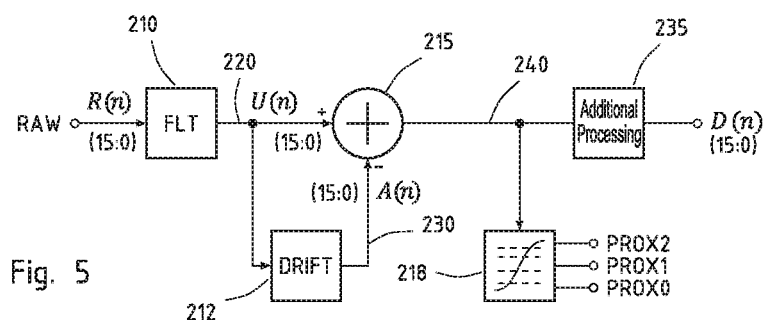
FIG. 5 illustrates schematically the architecture of a digital processor that could be employed in the frame of the invention.

FIG. 5 shows in simplified fashion a possible architecture of the treatment carried out by the digital processor 65 for each channel. The raw samples R(n) from the ADC are treated by an input filter 210 to remove noise and yield the "useful" signal U(n). Input filter 210 can be a linear low-pass filter, or a nonlinear one. The "useful" signal can be seen as the measure of a fraction $C_{use}$ of the capacity seen at the electrode after noise suppression, that is useful for determining proximity. The drift estimation unit 212 determines a drift component superposed to the U(n) samples, which is subtracted at 215. Finally, 235 stands for additional processing including de-bouncing, overflow/underflow detection (which may trigger a baseline compensation), and so on.

The processed samples D(n) may be fed to a discriminator 218 to generate proximity flags or combined with the reading of other electrodes for directional detection, as described below.

Importantly, the proximity detector 80 generates a directional proximity signal (PROX) based on the capacities seen by the first electrode 30, respectively by the second electrode 60. Different objects in various spatial relationship with the phone will affect in different measure the capacities seen by the first and second electrode, and this can be used for a directional discrimination.

When the user approaches the phone to the ear, for example, the capacities seen by the first and second electrode will both increase, in a given proportion. This should be discriminated against other situations which should not trigger a proximity signal like device grips, when the user holds the telephone in the hand, and loads the back electrode 60 considerably more than the top electrode 30, and finger slides, when the device slides a finger on the screen while holding the phone.

In a possible variant of the invention, the proximity sensor decides whether a proximity flag is to be raised based on the ratio, between the capacities seen by the first and the second electrode, or on their difference, or on a linear combination of the first and second capacity.

Figure 7:
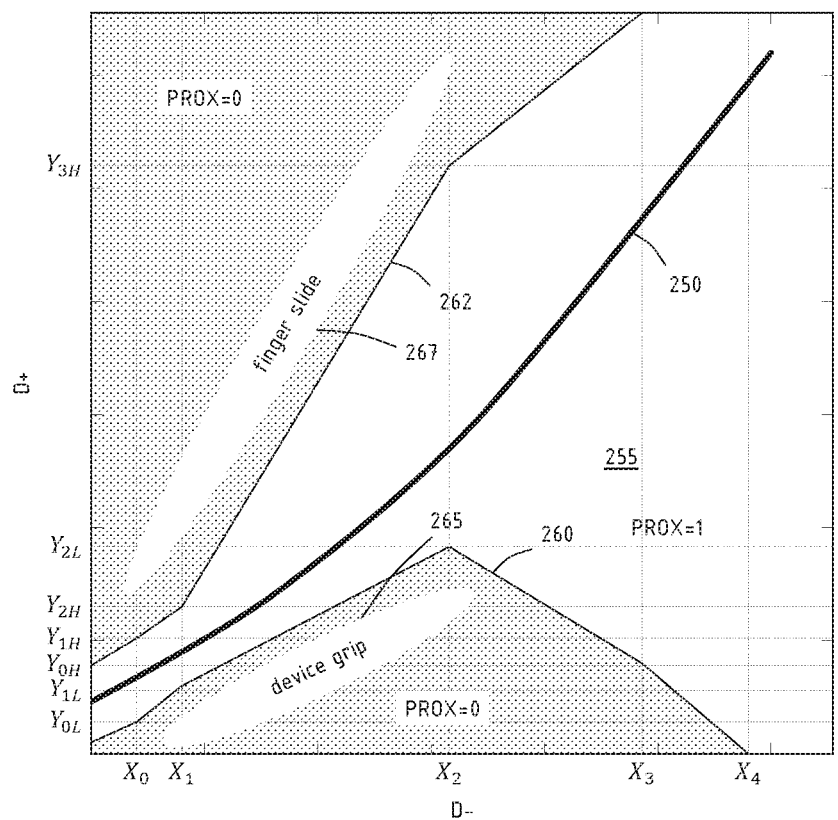
FIG. 7 plots the values of a directional proximity function based on the capacities seen by two electrodes, in an embodiment of the invention.

In a preferred variant, the proximity detection circuit 80 decides whether raising a proximity flag based on the position in a cartesian plane of a vector having the first and second capacity as components. FIG. 7 plots this situation. D− denotes the capacity of the back electrode 60 and D+ that of the top electrode 30. Device grip events cluster in a specific region 265, while finger slide events fall mostly in region 267. When the phone is brought to the ear, the capacities seen by both electrodes rise following, within a given approximation, curve 250. The detection circuit 80 is arranged to raise a proximity trigger when the vector defined by D+ and D− lies in the region 255 (white) between the lower threshold line 260 and the upper threshold line 262. Lower and upper thresholds are preferably programmable by the host system or preloaded in a firmware of the proximity circuit 80 and may be parameterized as piecewise linear functions, or in any other way.

At the same time as the directional proximity signal (PROX), the proximity circuit generates also a unidirectional proximity signal (SAR) that is used to reduce the RF power. In a favourable variant, the SAR signal is generated based on the capacity seen by the top electrode 30 that is also the RF antenna. This can be done simply by comparing the D+ digital signal against a threshold. More sophisticated processing is also possible and may consider, for example:

the rate of change of the D+ signal. A user's approach is expected to be gradual. Abrupt changes are indication of a noise event, or of the intervention of a load-matching circuit, if the electrode 30 is also the RF antenna.

The variance of the D+ signal. Little variation indicate that the telephone may be resting on a table rather than close to a body part.

Contribution of the D− signal coming from the other electrode.

In the plot of FIG. 8 the horizontal axis indicates time (the scale is such that the wrote axis spans across some hours), and the vertical axis is the capacity $C_{use}$ derived from one of the inputs of the readout circuit 80, after noise suppression and before subtraction of the drift. The discontinuities 453 corresponds to compensations of the offset by programming of the DAC 50. This example shows the capacity read at the IN1 input, connected to a guard electrode 65 on the back of the phone (see FIG. 6) but, reading any of the other inputs would show the same or similar behaviour and the invention could apply to those inputs as well.

The plot of FIG. 8 is acquired during an environment test in which a phone is placed in a controlled temperature chamber where it is progressively cooled (shaded region 480) and, after a certain time, extracted from the cell and allowed to warm up to room temperature (shaded region 490). The proximity signal (PROX0) sports several spurious transitions during the cooldown interval 480, and many more in the warmup phase 490 in which ice condensates on the phone, then melts and evaporates.

The inventors have realized that these spurious signals are statistically associated with steep variations of the $C_{use}$ signal, as the plot 8 shows. Conversely, legitimate triggers, are associate with a capacity reading that is flat, or has a moderate slope.

Figure 9:
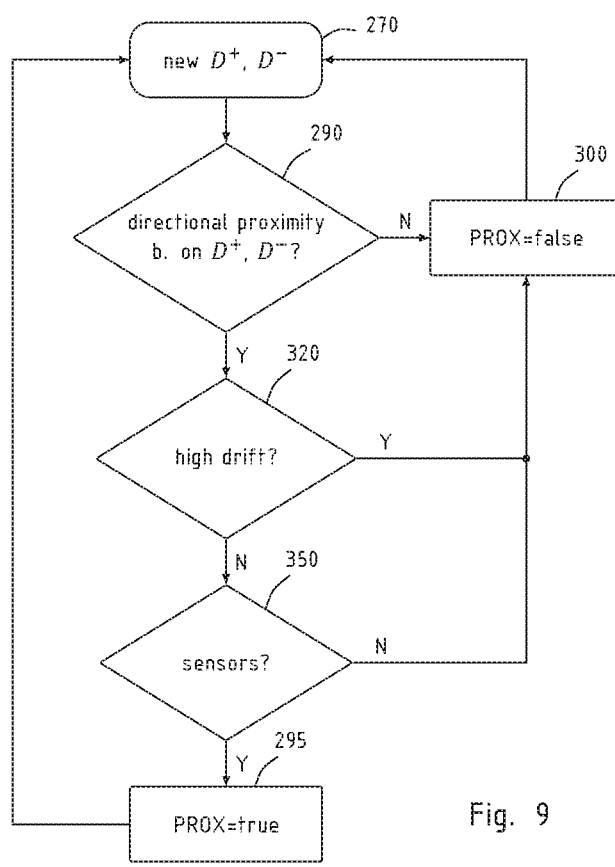
FIG. 9 shows in a chart the steps of generating a directional proximity signal and an omnidirectional SAR signal.

Preferably, the detection circuit 80 is arranged to compute the variation of one of the capacities read at one of its inputs. Operatively, this could be calculated as the average slope in a sliding window of samples, updates at each scan period. This slope is then compared against a positive and a negative threshold and, if it exceeds either of them (step 320 in flowchart of FIG. 9) the proximity signal is rejected, and is not applied, for example to the display of the mobile phone. As mentioned, the rejection step can be based on the slope of the signal from the first electrode 30, of the back electrode 60, of a reference channel, or of another non-represented electrode in or on the portable device 40.

In a preferred variant of the invention, the signals form the sensor 90 is also considered in the rejection. This fusion of data can happen in the proximity detection circuit 80, if the sensor signals are accessible thereto, or in the host system 100. For example, the proximity detector may consider whether the sensor indicate that the phone is being moved, or rather is stationary, and in the second case decide that the proximity signal is spurious and reject it. In the same line, the reading of a temperature sensor may indicate that a proximity signal is induced by a strong thermal drift rather than an approach of a user, and therefore should be rejected. All the information conveyed by the phone's sensors can be used to reject intelligently spurious proximity signals.

REFERENCE SYMBOLS USED IN THE FIGURES 20 sense electrode
25 guard electrode
30 top/first electrode/RF antenna
33 shield electrode
40 portable device
50 offset compensation
51 shield control
53 capacity-to-voltage converter
54 multiplexer
55 analogue-to-digital converter
57 RF transceiver
60 back/second electrode
63 shield electrode
65 partial guard electrode
67 digital processor
70 display
80 proximity detection circuit
90 sensors
100 host
105 microphone
110 loudspeaker
124 shield electrode
137 substrate
138 protection film
210 raw filter
212 drift estimation
215 adder
218 comparator
220 useful samples
230 estimated drift
235 additional processing
240 drift-subtracted samples
250 expected approach
260 lower threshold line
262 upper threshold line
265 expected region of device grip events
267 expected region of finger slide events
270 new samples available
290 decision step: directional proximity based on two electrodes
295 switching off the display, or reacting to a proximity flag
300 switching on the display, or reacting to a reset of a proximity flag
320 test for high drift
350 test for sensor information
450 useful capacity values
453 offset compensation steps
460 proximity signal
480 thermal transient: insertion in environmental chamber
490 thermal transient: extraction from environmental chamber

The invention claimed is:

1. A portable device comprising a proximity sensor, the proximity sensor being arranged for detecting a body portion of a user in proximity of the portable device; the proximity sensor comprising: a first electrode capacitively couplable with a body part of a user of the portable device outside of the portable device; a second electrode capacitively couplable with a body part of a user of the portable device outside of the portable device; a readout circuit operatively arranged for acquiring a capacitance seen by the first electrode and a capacitance seen by the second electrode, wherein the portable device has a touch-sensitive display on a front side, the first electrode is positioned on a lateral side of the portable device, and the second electrode is positioned on a back side of the portable device opposite the front side, wherein the lateral side of the portable device is a different side than the front side or the back side of the portable device, the proximity sensor being arranged to generate a proximity signal based on said capacitances, and to reject spurious proximity signals based on measurement of a variation in time of one of the capacitances read by the readout circuit and comparison of the variation in time with a predefined threshold.

2. The portable device of claim 1, wherein the first electrode is part of a radiofrequency antenna of the portable device and connected to the radio transmitter and to the readout circuit through decoupling elements.

3. The portable device of claim 1, further comprising a reference device (Cref), and wherein the readout circuit is being arranged to acquire also the capacitance of a reference device (Cref).

4. The portable device of claim 1, further comprising a display and/or a touch-sensitive panel, and a logic circuit arranged to inhibit the display and/or the touch sensitive panel based on said proximity signal.

5. The portable device of claim 1, wherein the measurement of the time variation comprises a time derivative of a capacitance read by the readout circuit.

6. The portable device of claim 1 further comprising at least one additional sensor, wherein the additional sensor is one of: accelerometer; gyroscope; ambient light sensor, temperature sensor, compass; clinometer.

7. The portable device of claim 6, wherein the identification of the spurious signals is further based on signals acquired from the additional sensors.

8. A portable device comprising a proximity sensor, the proximity sensor being arranged for detecting a body portion of a user in proximity of the portable device; the proximity sensor comprising: a first electrode capacitively couplable with a body part of a user of the portable device outside of the portable device; a second electrode capacitively couplable with a body part of a user of the portable device outside of the portable device and a reference device; a readout circuit operatively arranged for acquiring a capacitance seen by the first electrode, a capacitance seen by the second electrode and a capacitance of the reference device, the proximity sensor being arranged to generate a proximity signal based on said capacitances, and to reject spurious proximity signals based on:
  measurement of a variation in time of one of the capacitance seen by the first electrode, the capacitance seen by the second electrode or the capacitance of the reference device acquired by the readout circuit and comparison of the variation in time with a predefined threshold.

9. A portable device comprising a proximity sensor, the proximity sensor being configured for detecting a body portion of a user in proximity of the portable device; the proximity sensor comprising: a first electrode capacitively couplable with a body part of a user of the portable device outside of the portable device; a second electrode capacitively couplable with a body part of a user of the portable device outside of the portable device, a reference device; a readout circuit operatively arranged for acquiring a first capacitance seen by the first electrode, a second capacitance seen by the second electrode, and a reference capacitance of the reference device, the proximity sensor being configured to generate a proximity signal based on said first and second capacitances, and to reject spurious proximity signals based on a variation in time of one of the first capacitance, second capacitance, and reference capacitance.

10. The portable device of claim 9, the proximity sensor being configured for rejecting spurious proximity signal by comparing the variation in time of the reference capacitance with a predefined threshold.

11. The portable device of claim 9, wherein the reference capacitance of the reference device is less affected by proximity than the first and second capacitances.

* * * * *